US010468622B2

United States Patent
Shin et al.

(10) Patent No.: US 10,468,622 B2
(45) Date of Patent: Nov. 5, 2019

(54) ORGANIC LIGHT-EMITTING DISPLAY DEVICE AND DRIVING METHOD THEREOF

(71) Applicant: Samsung Display Co., Ltd., Yongin-si, Gyeonggi-do (KR)

(72) Inventors: Jae Min Shin, Suwon-si (KR); Woong Sik Kim, Hwaseong-si (KR); Won Sang Park, Yongin-si (KR); Seung Bae Kang, Suwon-si (KR); Min Woo Kim, Hwaseong-si (KR); Jong Ho Hong, Yongin-si (KR)

(73) Assignee: Samsung Display Co., Ltd. (KR)

( * ) Notice: Subject to any disclaimer, the term of this patent is extended or adjusted under 35 U.S.C. 154(b) by 69 days.

(21) Appl. No.: 15/649,498

(22) Filed: Jul. 13, 2017

(65) Prior Publication Data
US 2018/0102498 A1   Apr. 12, 2018

(30) Foreign Application Priority Data

Oct. 12, 2016  (KR) .......................... 10-2016-0131941

(51) Int. Cl.
| H01L 51/52 | (2006.01) |
| H01L 27/32 | (2006.01) |
| G09G 3/3233 | (2016.01) |

(52) U.S. Cl.
CPC ....... H01L 51/5218 (2013.01); G09G 3/3233 (2013.01); H01L 27/3248 (2013.01);
(Continued)

(58) Field of Classification Search
CPC ............ H01L 51/5218; H01L 51/5209; H01L 27/3248; H01L 27/3276; H01L 51/5234;
(Continued)

(56) References Cited

U.S. PATENT DOCUMENTS

2015/0001507 A1 * 1/2015 Kim .................... H01L 27/3246
257/40
2016/0181537 A1   6/2016 Pan et al.
(Continued)

FOREIGN PATENT DOCUMENTS

| KR | 10-2015-0134953 | 12/2015 |
| KR | 10-2016-0014259 | 2/2016 |

OTHER PUBLICATIONS

Mryasov et al., "Electronic band structure of indium tin oxide and criteria for transparent conducting behavior", Physical Review B, vol. 64, 233111, 2001, pp. 233111-1 thru 233111-3.
(Continued)

*Primary Examiner* — Aneeta Yodichkas
(74) *Attorney, Agent, or Firm* — Innovation Counsel LLP

(57) ABSTRACT

An organic light-emitting display device is provided. The organic light-emitting display device comprises a substrate, a thin-film transistor (TFT) disposed on the substrate, an overcoat layer disposed on the TFT, a first electrode disposed on the overcoat layer and including a lower electrode layer, an intermediate electrode layer, which is disposed on the lower electrode layer, and an upper electrode layer, which is disposed on the intermediate electrode layer, an emission layer disposed on the first electrode, and a second electrode disposed on the emission layer, wherein the first electrode includes a first area in which the lower electrode layer, the intermediate electrode layer and the upper electrode layer are sequentially stacked and a second area in which the lower electrode layer and the upper electrode layer are sequentially stacked.

12 Claims, 11 Drawing Sheets

(52) U.S. Cl.
CPC ...... *H01L 27/3276* (2013.01); *H01L 51/5209* (2013.01); *G09G 2300/0819* (2013.01); *G09G 2300/0842* (2013.01); *G09G 2300/0861* (2013.01); *G09G 2310/0243* (2013.01); *G09G 2310/0251* (2013.01); *G09G 2310/0262* (2013.01); *G09G 2330/028* (2013.01); *H01L 51/5234* (2013.01); *H01L 2251/5315* (2013.01)

(58) Field of Classification Search
CPC .......... H01L 2251/5315; G09G 3/3233; G09G 2310/0251; G09G 2310/0262; G09G 2300/0819; G09G 2300/0842; G09G 2310/0243; G09G 2330/028; G09G 2300/0861
See application file for complete search history.

(56) References Cited

U.S. PATENT DOCUMENTS

2016/0190521 A1    6/2016  Lee et al.
2016/0197126 A1    7/2016  Yoo et al.

OTHER PUBLICATIONS

Kim et al., "Electrical optical, and structural properties of indium-tin-oxide thin films for organic light-emitting devices", AIP Journal of Applied Physics 86, 6451, 1999, (12 pages).

\* cited by examiner

ORGANIC LIGHT-EMITTING DISPLAY DEVICE AND DRIVING METHOD THEREOF

This application claims priority to Korean Patent Application No. 10-2016-0131941, filed on Oct. 12, 2016, and all the benefits accruing therefrom under 35 U.S.C. § 119, the disclosure of which is incorporated herein by reference in its entirety.

BACKGROUND

1. Field

The present disclosure relates to an organic light-emitting display device and a driving method thereof.

2. Description of the Related Art

Various display devices for use in multimedia devices such as televisions (TVs), mobile phones, tablet computers, navigation systems, game machines and the like have been developed.

One such display device is an organic light-emitting display device. The organic light-emitting display device is a self-emitting display device having a wide viewing angle, excellent contrast and high response speed. The organic light-emitting display device includes an organic light-emitting diode (OLED), and electrodes for providing signals to the OLED may be formed as multilayers in order to increase the luminous efficiency of the OLED.

However, in a case where the electrodes are formed as multilayers, the display quality of the organic light-emitting display device may be lowered. Specifically, the electrodes may be disposed to cover most of the area of the OLED. To reflect light emitted from the bottom of the OLED back to the top of the OLED, the electrodes may be formed as multilayers to comprise a material capable of reflecting light. However, at the contact surfaces between pairs of adjacent layers of each of the multilayers, the amount of energy required for the movement of electrons or holes may increase, and resistance may locally increase accordingly. As a result, the display quality of the organic light-emitting display device may be lowered.

SUMMARY

Exemplary embodiments of the present disclosure provide an organic light-emitting display device capable of minimizing a decrease in display quality that may be caused by electrodes formed as multilayers.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, there is provided an organic light-emitting display device. The organic light-emitting display device comprises a substrate, a thin-film transistor (TFT) disposed on the substrate, an overcoat layer disposed on the TFT, a first electrode disposed on the overcoat layer and including a lower electrode layer, an intermediate electrode layer which is disposed on the lower electrode layer, and an upper electrode layer which is disposed on the intermediate electrode layer, an emission layer disposed on the first electrode, and a second electrode disposed on the emission layer, wherein the first electrode includes a first area in which the lower electrode layer, the intermediate electrode layer and the upper electrode layer are sequentially stacked and a second area in which the lower electrode layer and the upper electrode layer are sequentially stacked.

The organic light-emitting display device may have the intermediate electrode layer have a higher reflectivity than the lower and upper electrode layers.

The organic light-emitting display device may have the lower and upper electrode layers are transparent electrodes, and the intermediate electrode layer is a reflective electrode.

The organic light-emitting display device may have the first area is disposed to overlap with the emission layer.

The organic light-emitting display device may have a contact hole disposed to overlap with the first electrode, wherein the contact hole is disposed in the second area.

The organic light-emitting display device may have the second area is disposed to surround the first area.

The organic light-emitting display device may have the upper electrode layer is disposed to overlap with the intermediate electrode layer.

The organic light-emitting display device may have the second area is provided as multiple patterns disposed along the edges of the first area and spaced apart from one another.

The organic light-emitting display device may have the intermediate electrode layer is formed of aluminum (Al), silver (Ag), gold (Au), platinum (Pt), chromium (Cr), or an alloy thereof.

The organic light-emitting display device may have a resistance between bottom and top surfaces of the first electrode, measured from the first area, is lower than a resistance between the bottom and top surfaces of the first electrode, measured from the second area.

The organic light-emitting display device may have a pixel defining layer disposed between the first and second electrodes, wherein the emission layer is disposed in an opening of the pixel defining layer.

The organic light-emitting display device may have the first area is disposed to overlap with the opening.

According to the aforementioned and other exemplary embodiments of the present disclosure, there is provided an organic light-emitting display device. The organic light-emitting display device comprises a plurality of pixels receiving a gate signal, a data signal, an initialization control signal, a stress control signal, a first power supply voltage, a second power supply voltage, an initialization voltage and a stress voltage, wherein each of the plurality of pixels includes: a first transistor including a first terminal configured to receive the first power supply voltage and generate a driving current; a second transistor including a first terminal configured to receive the data signal, a second terminal electrically connected to a control terminal of the first transistor, and a control terminal receiving the gate signal; a storage capacitor including a first terminal configured to receive the first power supply voltage and a second terminal electrically connected to the control terminal of the first transistor; an organic light-emitting diode (OLED) including a first terminal electrically connected to the second terminal of the first transistor and a second terminal configured to receive the second power supply voltage and emit light based on the driving current; an initialization transistor including a first terminal configured to receive the initialization voltage, a second terminal electrically connected to the first terminal of the OLED, and a control terminal configured to receive the initialization control signal; and an overloading transistor including a first terminal configured to receive the stress voltage, a second terminal electrically connected to the first terminal of the OLED, and a control terminal configured to receive the stress control signal.

The organic light-emitting display device may have the initialization control signal is a same signal as the stress control signal.

The organic light-emitting display device may have the initialization voltage and the stress voltage are simultaneously provided to the first terminal of the OLED.

The organic light-emitting display device may have the first and second transistors are turned off during a period when the initialization transistor and the overloading transistor are turned on.

The organic light-emitting display device may have the initialization voltage and the stress voltage have different levels.

The organic light-emitting display device may have the stress voltage is higher than the initialization voltage.

The organic light-emitting display device may have the stress control signal is an initialization control signal of a previous stage.

The organic light-emitting display device may have the initialization voltage is provided to the first terminal of the overloading transistor after the application of the initialization voltage and the stress voltage to the first terminal of the OLED.

Other features and exemplary embodiments may be apparent from the following detailed description, the drawings and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

Figure 1:
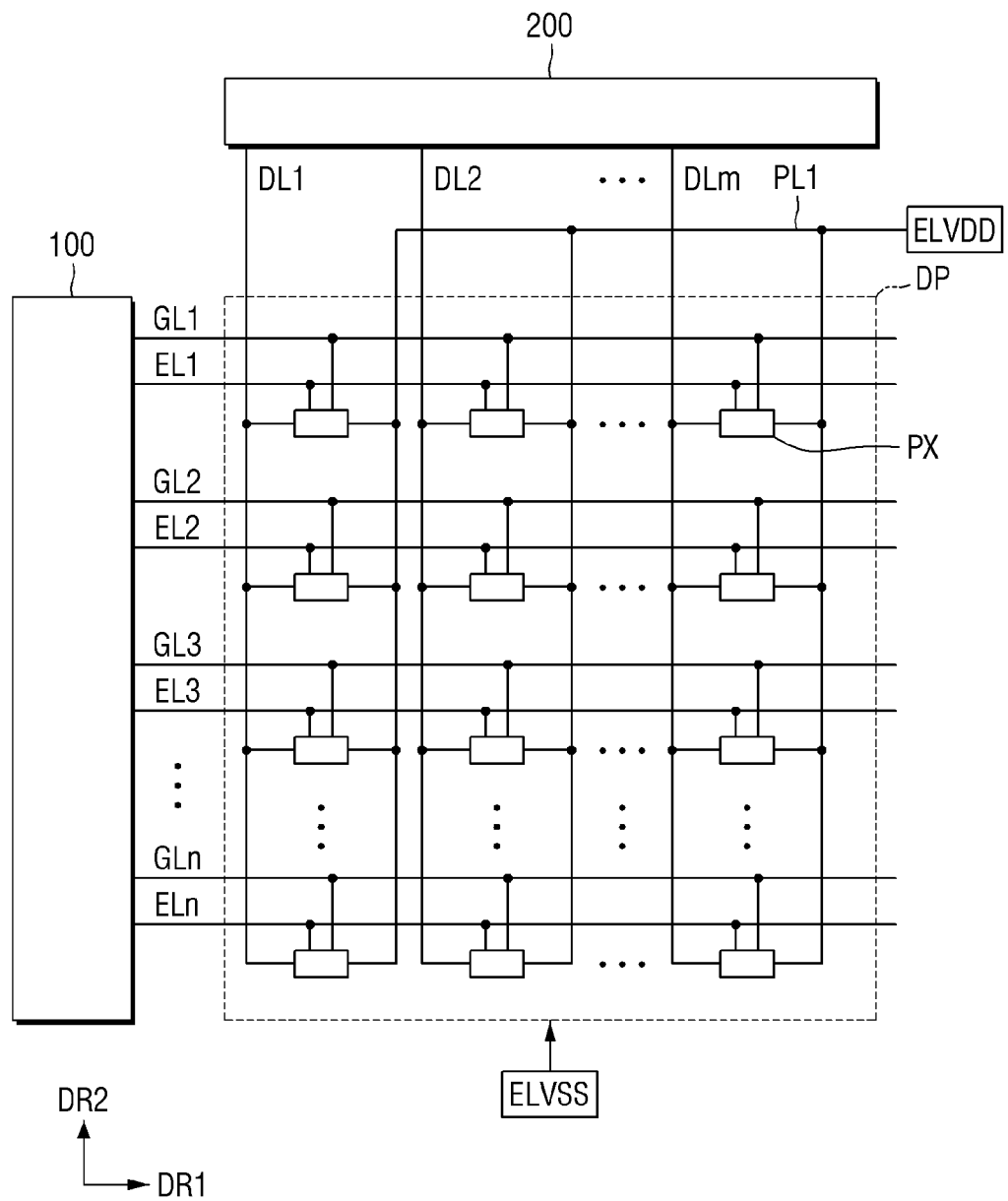
FIG. 1 is a block diagram of an organic light-emitting display device according to an exemplary embodiment of the present disclosure.

The present inventive concept will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

In the present inventive concept, an electronic apparatus may be any apparatus provided with a display device. Examples of the electronic apparatus may include smart phones, mobile phones, navigators, game machines, TVs, car head units, notebook computers, laptop computers, tablet computers, personal media players (PMPs), and personal digital assistants (PDAs). The electronic apparatus may be embodied as a pocket-sized portable communication terminal having a wireless communication function. Further, the display device may be a flexible display device capable of changing its shape.

Hereinafter, embodiments of the present inventive concept will be described with reference to the attached drawings.

FIG. 1 is a block diagram of an organic light-emitting display device according to an exemplary embodiment of the present disclosure.

Referring to FIG. 1, the organic light-emitting display device includes a scan driver 100, a data driver 200 and a display panel DP.

The scan driver 100 receives gate control signals (not illustrated) from a timing controller (not illustrated). The gate control signals may include a vertical start signal for starting the operation of the scan driver 100 and a clock signal for determining the output timing of signals. The scan driver 100 generates a plurality of gate signals and sequentially outputs the plurality of gate signals to a plurality of gate lines GL1 to Glen, respectively, which will be described later. The scan driver 100 generates a plurality of emission control signals in response to the gate control signals, and outputs the plurality of emission control signals to a plurality of emission lines EL1 to ELn, respectively, which will be described later.

FIG. 1 illustrates an example in which the plurality of gate signals and the plurality of emission control signals are both output from a single scan driver, i.e., the scan driver 100, but the present disclosure is not limited thereto. That is, in another example, a plurality of scan drivers may be provided to divide and output the plurality of gate signals and to divide and output the plurality of emission control signals. Also, in another example, a driving circuit for generating and outputting the plurality of gate signals and a driving circuit for generating and outputting the plurality of emission control signals may be separately provided.

The data driver 200 receives data control signals (not illustrated) and a plurality of image data (not illustrated) from the timing controller. The data driver 200 converts the plurality of image data into a plurality of data signals and outputs the plurality of data signals to a plurality of data lines DU to DLm, respectively, which are insulated from the gate lines GL1 to GLn. The plurality of data signals are analog voltages corresponding to the gray levels of the plurality of image data.

The display panel DP includes the gate lines GL1 to GLn, the emission lines EL1 to ELn, the data lines DL1 to DLm and a plurality of pixels PX. The gate lines GL1 to GLn extend in a first direction DR1 and are arranged in a second direction DR2 that intersects the first direction DR1. The emission lines EL1 to ELn may be arranged in parallel to the gate lines GL1 to GLn, respectively. The data lines DL1 to DLm are insulated from the gate lines GL1 to GLn and intersect the gate lines GL1 to GLn.

Each of the pixels PX is connected to one of the gate lines GL1 to GLn, one of the emission lines EL1 to ELn and one of the data lines DL1 through DLm. Although not specifically illustrated in FIG. 1, each of the pixels PX may be connected to more than one of the gate lines GL1 through GLn.

Figure 2:
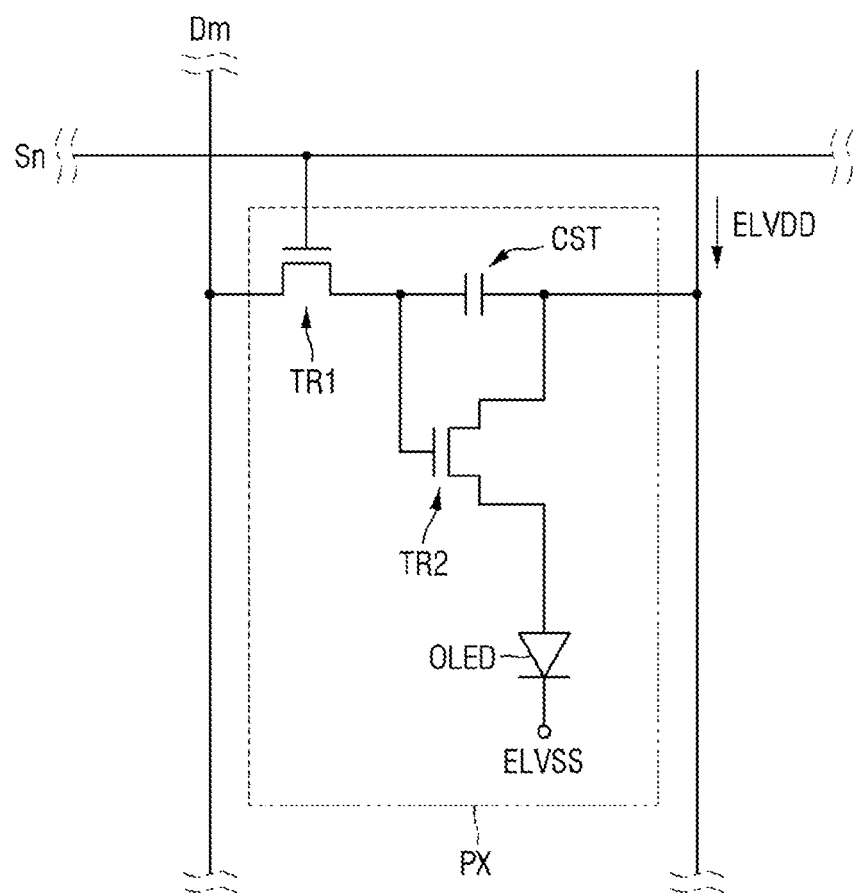
FIG. 2 is an equivalent circuit diagram of a pixel of the organic light-emitting display device according to the exemplary embodiment of FIG. 1.

FIG. 2 is an equivalent circuit diagram of a pixel of the organic light-emitting display device according to the exemplary embodiment of FIG. 1.

Referring to FIG. 2, a pixel PX includes an organic light-emitting diode (OLED) "OLED", a first transistor TR1, a second transistor TR2 and a storage capacitor CST. The equivalent circuit of the pixel PX is not particularly limited to that illustrated in FIG. 2, but may vary.

The first transistor TR1 includes a control electrode, which is connected to a gate line GL, an input electrode, which is connected to a data line DL, and an output electrode. The first transistor TR1 outputs a data signal Dm applied to the data line DL in response to a gate signal applied to the gate line GL.

The storage capacitor CST includes a first electrode, which is connected to the first transistor TR1, and a second electrode, which receives a first power supply voltage ELVDD. The storage capacitor CST is charged with a voltage corresponding to the data signal Dm received from the first transistor TR1.

The second transistor TR2 includes a control electrode, which is connected to the output electrode of the first transistor TR1 and the first electrode of the storage capacitor CST, an input electrode, which receives the first power supply voltage ELVDD, and an output electrode. The output electrode of the second transistor TR2 is connected to the OLED "OLED". The second transistor TR2 controls a driving current that flows in the OLED "OLED" to correspond with the voltage stored in the storage capacitor CST.

The OLED "OLED" includes an anode electrode AND, which is connected to the second transistor TR2 and receives the first power supply voltage ELVDD, and a cathode electrode CTD, which receives a second power supply voltage ELVSS. The OLED "OLED" further includes an emission layer EML, which is disposed between the anode electrode AND and the cathode electrode CTD. The OLED "OLED" emits light while the second transistor TR2 is turned on.

Figure 3:
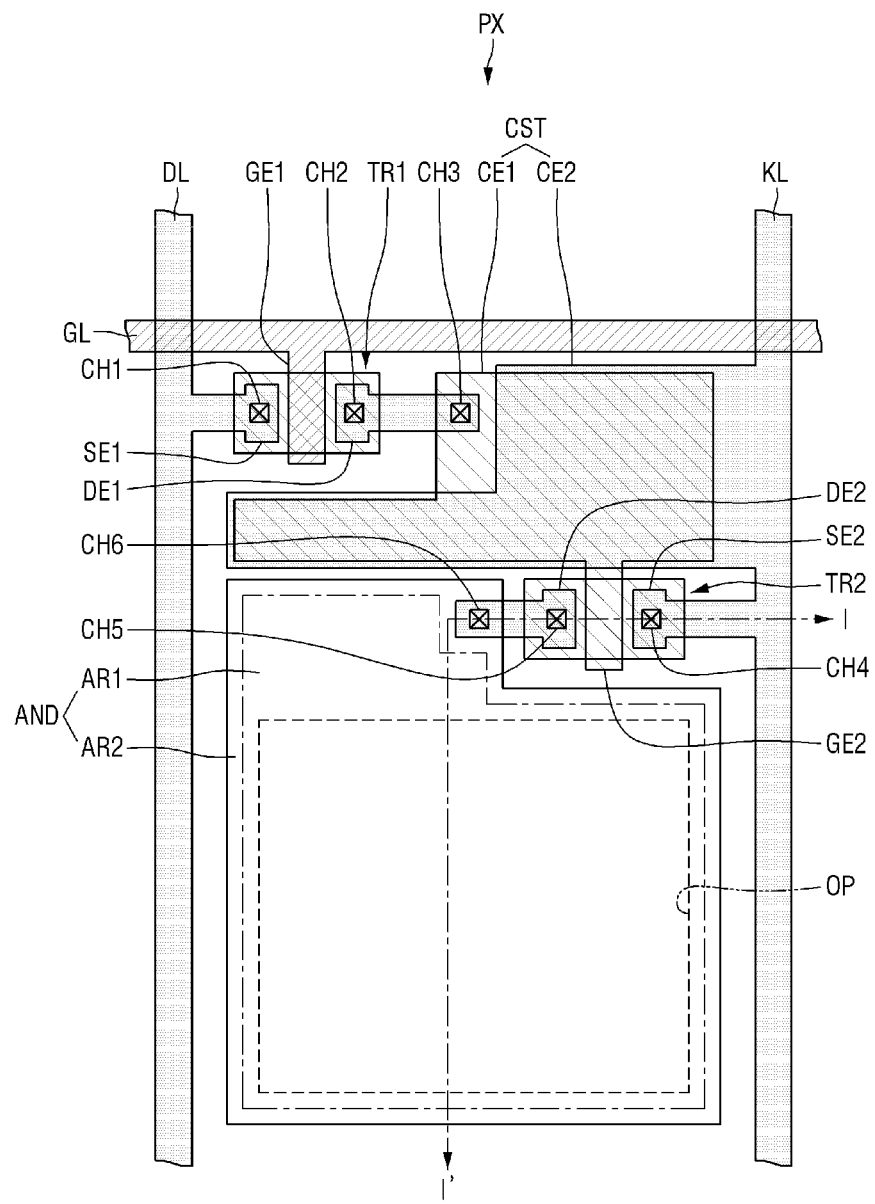
FIG. 3 is a layout view of a pixel of the organic light-emitting display device according to the exemplary embodiment of FIG. 1.
Figure 4:
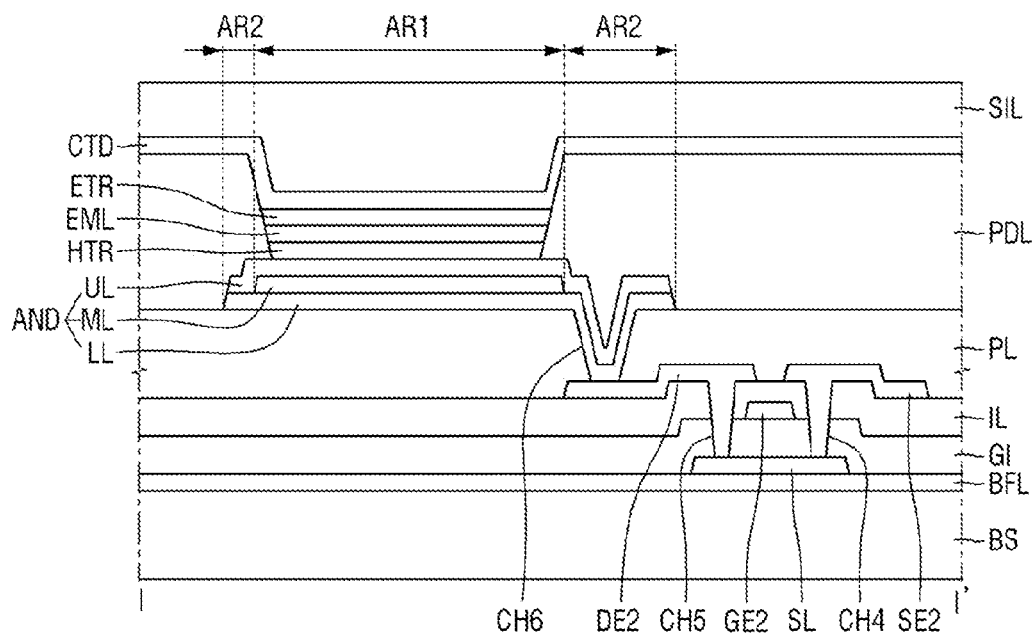
FIG. 4 is a cross-sectional view taken along line I-I' of FIG. 3.

FIG. 3 is a layout view of a pixel of the organic light-emitting display device according to the exemplary embodiment of FIG. 1, and FIG. 4 is a cross-sectional view taken along line I-I' of FIG. 3.

The organic light-emitting display device according to the exemplary embodiment of FIG. 1 will hereinafter be described in further detail with reference to FIGS. 3 and 4.

The display panel DP includes a base substrate BS, a buffer layer BFL, signal lines (GL and DL) and a pixel PX. The elements of the display panel DP, i.e., the base substrate BS, the buffer layer BFL, the signal lines (GL and DL) and the pixel PX, may vary depending on the type of the display panel DP.

The base substrate BS may be formed of an insulating material.

The buffer layer BFL is disposed on the base substrate BS.

The buffer layer BFL prevents impurities present in the base substrate BS from flowing into the pixel PX during the manufacture of the organic light-emitting display device. Specifically, the buffer layer BFL prevents the impurities from diffusing into a semiconductor layer SL of the pixel PX. The impurities may be introduced from the outside of the organic light-emitting display device or may be generated by pyrolysis of the base substrate BS. The impurities may be a gas or sodium discharged from the base substrate BS. Also, the buffer layer BFL blocks moisture from flowing into the pixel PX from the outside of the organic light-emitting display device.

The signal lines (GL and DL) and the pixel PX are arranged on the buffer layer BFL. The semiconductor layer SL of a second transistor TR2 is disposed on the buffer layer BFL. The semiconductor layer SL may comprise polysilicon or amorphous silicon formed at low temperature. The semiconductor layer SL may further comprise a metal oxide semiconductor.

The semiconductor layer SL includes a channel region, which serves as a channel through which electrons or holes can travel, and first and second ion-doped regions, which are disposed with the channel region interposed therebetween.

A gate insulating layer GI, which covers the semiconductor layer SL, is disposed on the buffer layer BFL. The gate insulating layer GI includes an organic film and/or an inorganic film. Specifically, the gate insulating layer GI may include a plurality of inorganic thin films. The plurality of inorganic thin films may include a silicon nitride layer and a silicon oxide layer.

A gate line GL is disposed on the gate insulating layer GI. A control electrode GE1 (hereinafter, the first control electrode GE1) of a first transistor TR1 and a control electrode GE2 (hereinafter, the second control electrode GE2) of the second transistor TR2 are disposed on the gate insulating layer GI.

A first electrode CE1 of a storage capacitor CST may be disposed on the gate insulating layer GI, but the location of the first electrode CE1 is not particularly limited. The first electrode CE1 may be fabricated by the same photolithography process as the gate line GL. In other words, the first electrode CE1 may be formed of the same material as the gate line GL.

An interlayer insulating layer IL, which covers the first control electrode GE1, the second control electrode GE2 and the first electrode CE1, is disposed on the gate insulating layer GI. The interlayer insulating layer IL may include an organic film and/or an inorganic film. The interlayer insulating layer IL may include a plurality of inorganic thin films. The plurality of inorganic thin films may include a silicon nitride layer and a silicon oxide layer.

The data line DL and a power line KL are disposed on the interlayer insulating layer IL. An input electrode SE1 (hereinafter, the first input electrode SE1) and an output electrode DE1 (hereinafter, the first output electrode DE1) of the first transistor TR1 are disposed on the interlayer insulating layer IL. An input electrode SE2 (hereinafter, the second input electrode SE2) and an output electrode DE2 (hereinafter, the second output electrode DE2) of the second transistor TR2 are disposed on the interlayer insulating layer IL. The first input electrode SE1 is branched off from the data line DL. The second input electrode SE2 is branched off from the power line KL.

A second electrode CE2 of the storage capacitor CST may be disposed on the interlayer insulating layer IL, but the location of the second electrode CE2 is not particularly limited. The second electrode CE2 may be fabricated by the same photolithography process as the data line DL and the power line KL and may be formed of the same material as the data line DL and the power line KL.

The first input electrode SE1 and the first output electrode DE1 are connected to a semiconductor layer (not illustrated) of the first transistor TR1 via first and second contact holes CH1 and CH2, which penetrate the gate insulating layer GI and the interlayer insulating layer IL. The first output electrode DE1 is connected to the first electrode CE1 via a third contact hole CH3, which penetrates the interlayer insulating layer IL. The second input electrode SE2 and the second output electrode DE2 are connected to the semiconductor layer SL of the second transistor TR2 via fourth and fifth contact holes CH4 and CH5, which penetrate the gate insulating layer GI and the interlayer insulating layer IL. In another exemplary embodiment, the first transistor TR1 and the second transistor TR2 may be configured to have a bottom gate structure.

A passivation layer PL, which covers the first input electrode SE1, the first output electrode DE1, the second input electrode SE2 and the second output electrode DE2, is formed on the interlayer insulating layer IL. The passivation layer PL includes an organic film and/or an inorganic film. Specifically, the passivation layer PL may comprise an organic material to provide a planar surface.

A pixel defining layer PDL and an OLED "OLED" are disposed on the passivation layer PL. The OLED "OLED" includes an anode electrode AND, a hole transport region HTR, an emission layer EML, an electron transport region ETR and a cathode electrode CTD. The anode electrode AND is connected to the second output electrode DE2 via a sixth contact hole CH6, which penetrates the passivation layer PL. The locations of the anode electrode AND and the cathode electrode CTD of the OLED "OLED" may be reversed.

The anode electrode AND is disposed on the passivation layer PL. An opening OP of the pixel defining layer PDL exposes the anode electrode AND.

The anode electrode AND may be a pixel electrode and an anode electrode. The anode electrode AND may have a multilayer structure consisting of a plurality of layers that are formed of a transparent metal oxide and a metal.

The anode electrode AND includes a lower electrode layer LL, an intermediate electrode layer ML and an upper electrode layer UL.

The lower electrode layer LL may be directly connected to the second output electrode DE2 and may thus receive a voltage from the second output electrode DE2. The lower electrode layer LL may be a transmissive electrode, a transflective electrode, or a reflective electrode. In a case where the lower electrode layer LL is a transmissive electrode, the lower electrode layer LL may be formed of a transparent metal oxide such as indium tin oxide (ITO), indium zinc oxide (IZO), zinc oxide (ZnO), or indium tin zinc oxide (ITZO). In a case where the lower electrode layer LL is a transflective electrode or a reflective electrode, the lower electrode layer LL may comprise a metal such as silver (Ag), magnesium (Mg), aluminum (Al), platinum (Pt), palladium (Pd), gold (Au), nickel (Ni), neodymium (Nd), iridium (Ir), chromium (Cr), or a mixture thereof.

The intermediate electrode layer ML may be disposed on the lower electrode layer LL to overlap with part of the lower electrode layer LL. The intermediate electrode layer ML may reflect light emitted from the emission layer EML in an upward direction. In order to improve the reflection efficiency of the anode electrode AND, the intermediate electrode layer ML may be formed of a metal material having a high reflection efficiency such as Al, Ag, Au, Pt, or Cr or an alloy thereof. The intermediate electrode layer ML may receive the voltage provided to the lower electrode layer LL.

The upper electrode layer UL may be disposed on the lower electrode layer LL or the intermediate electrode layer ML to overlap with the intermediate electrode layer ML. The upper electrode layer UL may receive the voltage provided to the intermediate electrode layer ML or the lower electrode layer LL. The upper electrode layer LL may be a transmissive electrode, a transflective electrode, or a reflective electrode. In a case where the upper electrode layer LL is a transmissive electrode, the upper electrode layer LL may be formed of a transparent metal oxide such as ITO, IZO, ZnO, or ITZO. In a case where the upper electrode layer LL is a transflective electrode or a reflective electrode, the upper electrode layer LL may comprise a metal such as Ag, Mg, Al, Pt, Pd, Au, Ni, Nd, Ir, Cr, or a mixture thereof.

The anode electrode AND may include two areas having different stack structures, as viewed from a direction perpendicular to the top surface of the base substrate BS, i.e., the viewpoint of FIG. 3.

Specifically, the anode electrode AND includes a first area AR1 in which the lower electrode layer LL, the intermediate electrode layer ML and the upper electrode layer UL are sequentially stacked and a second area AR2 in which the lower electrode layer LL and the upper electrode layer UL are sequentially stacked.

The second area AR2 may be disposed to surround the first area AR1. Accordingly, the first area AR1 can be sufficiently secured, and the second area AR2 can also be sufficiently secured.

The upper electrode layer UL may be formed to overlap with the intermediate electrode layer ML. Accordingly, the anode electrode AND can smoothly transmit signals to the hole transport region HTR.

The first area AR1 may be disposed to overlap with the emission layer EML. Accordingly, since the intermediate electrode layer ML, which has a high reflectivity, is disposed in the first area AR1, the amount of light emitted upward can be sufficiently secured.

Since the anode electrode AND includes the first and second areas AR1 and AR2, the degradation of the display quality of the organic light-emitting display device can be minimized. Specifically, since the anode electrode AND is composed of three layers, resistance may increase locally near the surfaces of the three layers. That is, in areas near the surfaces of the three layers of the anode electrode AND, differences in electric potential are generated among the three layers of the anode electrode AND due to the formation of a hole injection barrier, and as a result, high resistance may be generated against the transmission of signals. However, the generation of such high resistance can be prevented because the first area AR1 includes a total of two contact surfaces, i.e., the contact surface between the lower electrode layer LL and the intermediate electrode layer ML and the contact surface between the intermediate electrode layer ML and the upper electrode layer UL, whereas the second area AR2 includes only one contact surface, i.e., the contact surface between the lower electrode layer LL and the upper electrode layer ML. Thus, a voltage can be smoothly transmitted by the anode electrode AND, and as a result, the display quality of the organic light-emitting display device can be improved.

The hole transport region HTR is disposed on the anode electrode AND. The hole transport region HTR may include at least one of a hole injection layer, a hole transport layer, a buffer layer and an electron blocking layer.

The hole transport region HTR may have a single-layer structure formed of a single material, a single-layer structure formed of a plurality of different materials or a multilayer structure formed of a plurality of different materials.

For example, the hole transport region HTR may have a single-layer structure formed of a plurality of different materials or may have a multilayer structure in which a hole injection layer and a hole transport layer, a hole injecting layer, a hole transport layer and a buffer layer, a hole injection layer and a buffer layer, a hole transport layer and a buffer layer, or a hole injection layer, a hole transport layer and an electron blocking layer are sequentially stacked on the anode electrode AND, but the present disclosure is not limited thereto.

The hole transport region HTR may be formed by various methods such as vacuum deposition, spin coating, casting, Langmuir-Blodgett (LB) deposition, inkjet printing, laser printing, or laser induced thermal imaging (LITI).

The emission layer EML is disposed on the hole transport region HTR. The emission layer EML may be formed by various methods such as vacuum deposition, spin coating, casting, LB deposition, inkjet printing, laser printing, or LITI.

The material of the emission layer EML is not particularly limited. For example, the emission layer EML may be formed of a material emitting red light, green light, or blue light and may comprise a fluorescent material or a phosphorescent material. The emission layer EML may include a host and a dopant.

The type of the host of the emission layer EML is not particularly limited. For example, tris(8-hydroxyquinolino) aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl) benzene (TPBi), 3-tert-butyl-9,10-di(naphth-2-yl) anthracene (TBADN), distyrylarylene (DSA), 4,4'-bis(9-carbazolyl)-2,2'-dimethyl-biphenyl (CDBP), or 2-Methyl-9, 10-bis(naphthalen-2-yl)anthracene (MADN) may be used as the host of the emission layer EML.

In a case where the emission layer EML emits red light, the emission layer EML may comprise a fluorescent material containing tris(dibenzoylmethanato)phenanthoroline europium (PBD: Eu(DBM)3(Phen)) or perylene. In a case where the emission layer EML emits red light, the dopant of the emission layer EML may be selected from a metal complex or an organometallic complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (PtOEP).

In a case where the emission layer EML emits green light, the emission layer EML may comprise a fluorescent material containing Alq3. In a case where the emission layer EML emits green light, the dopant of the emission layer EML may be selected from a metal complex or an organometallic complex such as fac-tris(2-phenylpyridine)iridium (Ir(ppy) 3).

In a case where the emission layer EML emits blue light, the emission layer EML may comprise a fluorescent material containing any one selected from the group consisting of spiro-DPVBi, spiro-6P, distyrylbenzene (DSB), distyrylarylene (DSA), a polyfluorene (PFO)-based polymer and a poly(p-phenylene vinylene) (PPV)-based polymer. In a case where the emission layer EML emits blue light, the dopant of the emission layer EML may be selected from a metal complex or an organometallic complex such as, for example, (4,6-F2ppy)2Irpic.

The electron transport region ETR is disposed on the emission layer EML.

The electron transport region ETR may include at least one of a hole blocking layer, an electron transport layer and an electron injection layer, but the present disclosure is limited thereto. For example, the electron transport region ETR may have a multilayer structure in which an electron transport layer and an electron injection layer or a hole blocking layer, an electron transport layer and an electron injection layer are sequentially stacked on the emission layer EML or a single-layer structure in which two of a hole blocking layer, an electron transport layer and an electron injection layer are mixed together, but the present disclosure is not limited thereto.

The electron transport region ETR may be formed by various methods such as vacuum deposition, spin coating, casting, LB deposition, inkjet printing, laser printing, or LITI.

The cathode electrode CTD is disposed on the electron transport region ETR.

The cathode electrode CTD may be a common electrode and a cathode electrode. The cathode electrode CTD may be a transmissive electrode, a transflective electrode, or a reflective electrode. In a case where the cathode electrode CTD is a transmissive electrode, the cathode electrode CTD may comprise Li, Ca, LiF/Ca, LiF/Al, Al, Mg, BaF, Ba, Ag, or a compound or mixture thereof (for example, the mixture of Ag and Mg). The cathode electrode CTD may include an auxiliary electrode. The auxiliary electrode may include a film obtained by depositing Li, Ca, LiF/Ca, LiF/Al, Al, Mg, BaF, Ba, Ag, or a compound or mixture thereof (for example, the mixture of Ag and Mg) to face the emission layer EML and a transparent metal oxide disposed on the film and formed of, for example, ITO, IZO, ZnO, ITZO, molybdenum (Mo), or titanium (Ti). In a case where the cathode electrode CTD is a transflective or reflective electrode, the cathode electrode CTD may comprise Ag, Mg, Al, Pt, Pd, Au, Ni, Nd, Ir, Cr, Li, Ca, LiF/Ca, LiF/Al, Mo, Ti, or a compound or mixture thereof (for example, the mixture of Ag and Mg). In this case, the cathode electrode CTD may have a multilayer structure including a reflective or transflective film formed of Ag, Mg, Al, Pt, Pd, Au, Ni, Nd, Ir, Cr, Li, Ca, LiF/Ca, LiF/Al, Mo, Ti, or a compound or mixture thereof (for example, the mixture of Ag and Mg) and a transparent conductive film formed of ITO, IZO, ZnO, or ITZO.

An encapsulation layer SIL is disposed on the cathode electrode CTD. The encapsulation layer SIL may include a plurality of thin film encapsulation layers. The thin film encapsulation layers may include a silicon nitride layer and a silicon oxide layer.

An organic light-emitting display device according to another exemplary embodiment of the present disclosure will hereinafter be described with reference to FIG. 5.

Figure 5:
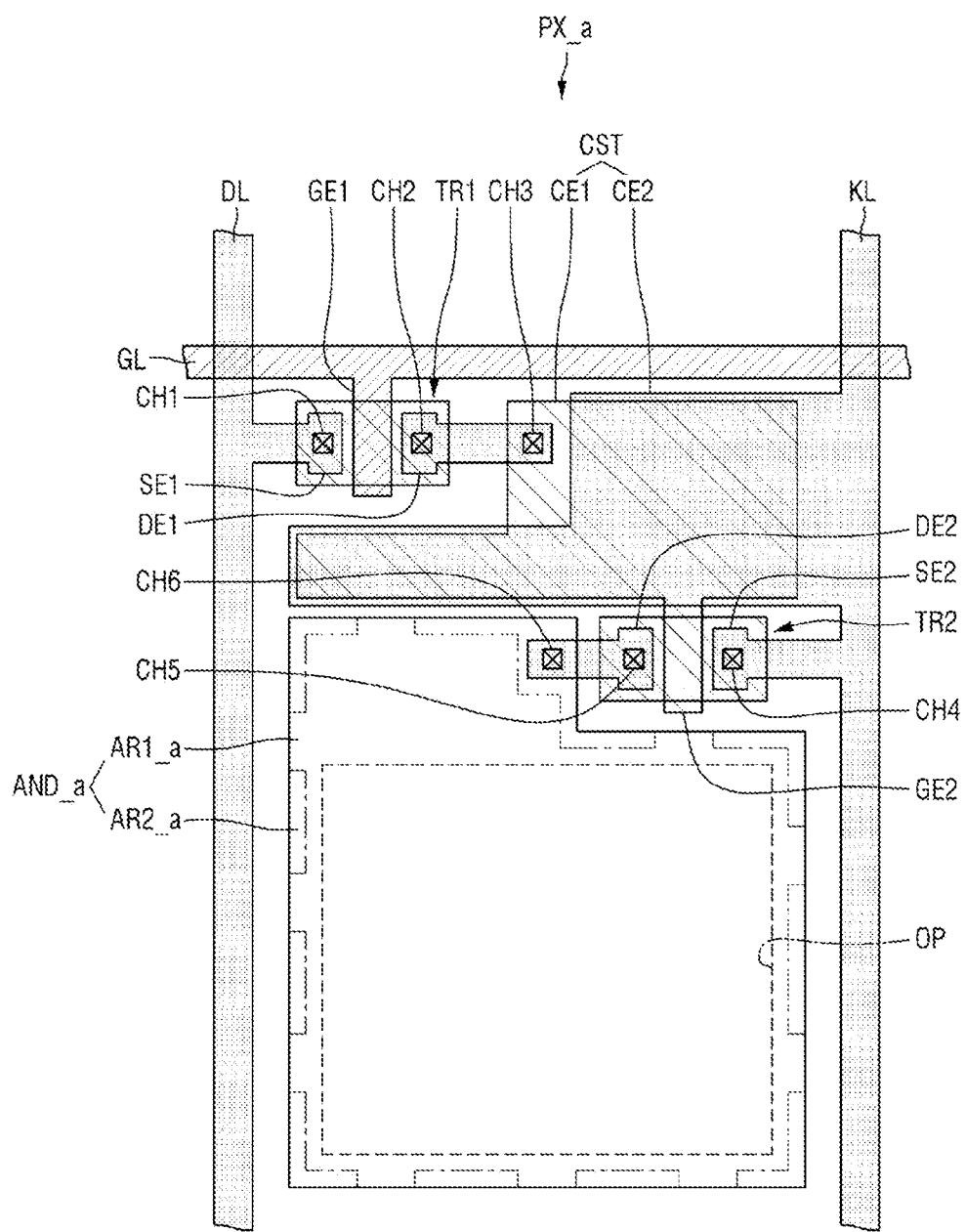
FIG. 5 is a layout view of a pixel of an organic light-emitting display device according to another exemplary embodiment of the present disclosure.

FIG. 5 is a layout view of a pixel of an organic light-emitting display device according to another exemplary embodiment of the present disclosure.

The structure of an anode electrode AND_a of a pixel PX_a of FIG. 5 differs from the structure of the anode electrode AND of the pixel PX of FIG. 3. The pixel PX_a of FIG. 5 will hereinafter be described, focusing mainly on differences with the pixel PX of FIG. 3.

Referring to FIG. 5, the arrangement of a first area AR_1a and a second area AR_2a of the anode electrode AND_a of the pixel PX_a may differ from the arrangement of the first area AR1 and the second area AR2 of the anode electrode AND of FIG. 3. Specifically, the second region AR2_a may be disposed along the edges of the first region AR1_a to form a plurality of strips that are spaced apart from one another.

Due to this arrangement of the first and second areas AR1_a and AR2_a, the ratio of the second area AR2_a, which has a relatively low reflectivity, to the entire area of the anode electrode AND_a is lower than the ratio of the second area AR2 of FIG. 3 to the entire area of the anode electrode AND of FIG. 3. Accordingly, the reflectivity of the anode electrode AND_a may be lower than the reflectivity of the anode electrode AND.

However, the shape of the second area AR2_a is not particularly limited, and may be partially modified. For example, the second area AR2_a may have different lengths or widths from one region to another region or may be arranged to form shapes other than strips.

Figure 6:
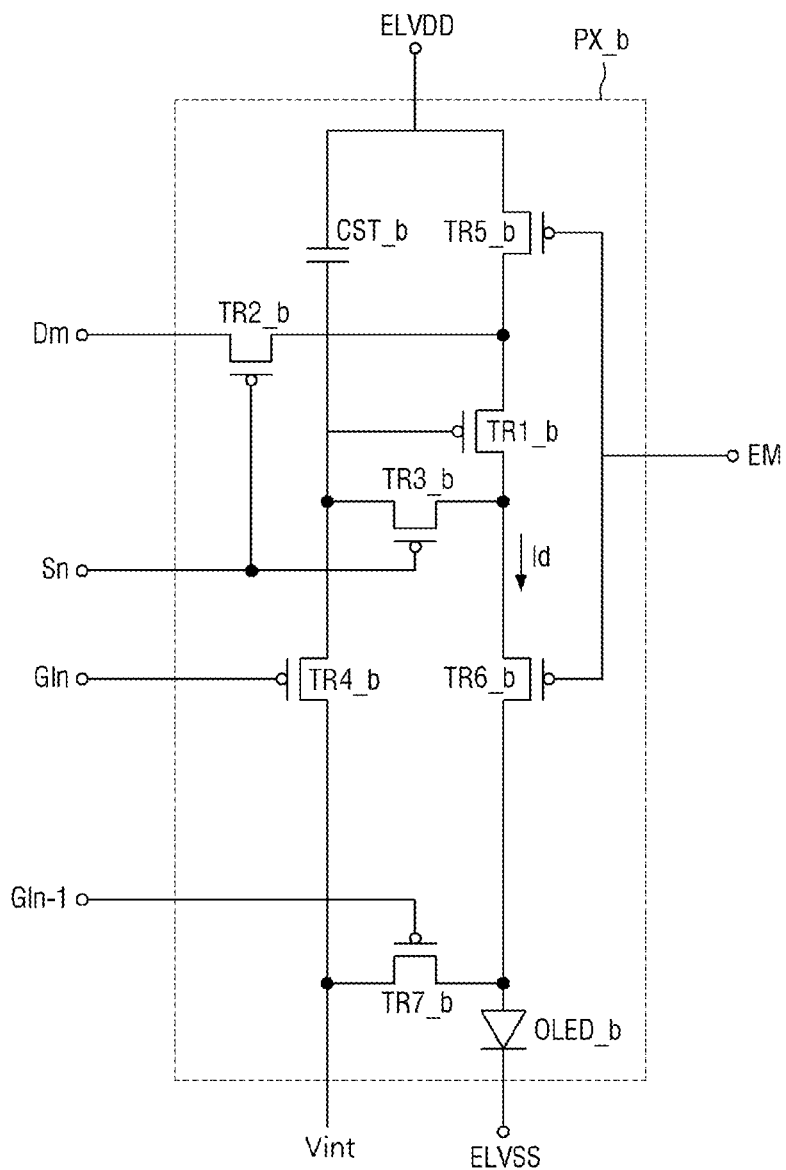
FIG. 6 is an equivalent circuit diagram of a pixel of an organic light-emitting display device according to another exemplary embodiment of the present disclosure.

FIG. 6 is an equivalent circuit diagram of a pixel of an organic light-emitting display device according to another exemplary embodiment of the present disclosure.

A pixel PX_b of FIG. 6 differs from the pixel PX of FIG. 2 in that it includes more transistors than the pixel PX of FIG. 2 to be driven.

Referring to FIG. 6, the pixel PX_b includes an OLED "OLED_b", a first transistor TR1_b, a second transistor TR2_b, a third transistor TR3_b, a storage capacitor CST_b, a fourth transistor TR4_b, a fifth transistor TR5_b, a sixth transistor TR6_b and a seventh transistor TR7_b.

The OLED "OLED_b" may emit light based on a driving current Id. The OLED "OLED_b" may include a first terminal and a second terminal. The second terminal of the OLED "OLED_b" may receive a second power supply voltage ELVSS. For example, the first terminal of the OLED "OLED_b" may be an anode terminal, and the second terminal of the OLED "OLED_b" may be a cathode terminal. In another example, the first terminal of the OLED "OLED_b" may be a cathode terminal, and the second terminal of the OLED "OLED_b" may be an anode terminal.

The second transistor TR2_b may include a gate terminal, a first terminal and a second terminal. The gate terminal of the second transistor TR2_b may receive a scan signal Sn of a current stage. The first terminal of the second transistor TR2_b may receive a data signal Dm. The second terminal of the second transistor TR2_b may be coupled to the first terminal of the first transistor TR1_b. For example, the first terminal of the second transistor TR2_b may be a source terminal, and the second terminal of the second transistor TR2_b may be a drain terminal. In another example, the first terminal of the second transistor TR2_b may be a drain terminal, and the second terminal of the second transistor TR2_b may be a source terminal.

The second transistor TR2_b may provide the data signal Dm to the first terminal of the first transistor TR1_b during an active period of the scan signal Sn. In this case, the second transistor TR2_b may operate in a linear region.

The third transistor TR3_b may include a gate terminal, a first terminal and a second terminal. The gate terminal of the third transistor TR3_b may receive the scan signal Sn. The first terminal of the third transistor TR3_b may be connected to the second terminal of the first transistor TR1_b. The second terminal of the third transistor TR3_b may be connected to the gate terminal of the first transistor TR1_b. For example, the first terminal of the third transistor TR3_b may be a source terminal, and the second terminal of the third transistor TR3_b may be a drain terminal. In another example, the first terminal of the third transistor TR3_b may be a drain terminal, and the second terminal of the third transistor TR3_b may be a source terminal.

The third transistor TR3_b may connect the gate terminal and the second terminal of the first transistor TR1_b during the active period of the scan signal Sn. In this case, the third transistor TR3_b may operate in a linear region. That is, the third transistor TR3_b may diode-connect the first transistor TR1_b during the active period of the scan signal Sn. Since the first transistor TR1_b is diode-connected, as much a voltage difference as the threshold voltage of the first transistor TR1_b may be generated between the first terminal of the first transistor TR1_b and the gate terminal of the first transistor TR1_b by the threshold voltage of the first transistor TR1_b. As a result, a voltage obtained by adding the generated voltage difference (i.e., the threshold voltage of the first transistor TR1_b) to the voltage of the data signal Dm, which is provided to the first terminal of the first transistor TR1_b during the active period of the scan signal Sn, may be provided to the gate terminal of the first transistor TR1_b. That is, the data signal Dm may be compensated by as much as the threshold voltage of the first transistor TR1_b, and the compensated data signal Dm may be provided to the gate terminal of the first transistor TR1_b. Accordingly, the problem of non-uniformity in the driving current Id that may be caused by a deviation in the threshold voltage of the first transistor TR1_b can be addressed.

The storage capacitor CST_b may be connected between the first power supply voltage ELVDD and the gate terminal of the first transistor TR1_b. The storage capacitor CST_b may maintain the voltage of the gate terminal of the first transistor TR1_b during an inactive period of the scan signal Sn. The inactive period of the scan signal Sn may include an active period of the emission signal EM, and the driving current Id generated by the first transistor TR1_b during the active period of the emission signal EM may be provided to the OLED "OLED_b". Thus, the driving current Id, which is generated by the first transistor TR1_b, may be provided to the OLED "OLED_b" based on the voltage maintained by the storage capacitor CST_b.

The fourth transistor TR4_b may include a gate terminal, a first terminal and a second terminal. The gate terminal of the fourth transistor TR4_b may receive an initialization control signal Gln of the current stage. The first terminal of the fourth transistor TR4_b may receive an initialization voltage Vint. The second terminal of the fourth transistor TR4_b may be connected to the gate terminal of the first transistor TR1_b. For example, the first terminal of the fourth transistor TR4_b may be a source terminal, and the second terminal of the fourth transistor TR4_b may be a drain terminal. In another example, the first terminal of the fourth transistor TR4_b may be a drain terminal, and the second terminal of the fourth transistor TR4_b may be a source terminal.

The fourth transistor TR4_b may provide the initialization voltage Vint to the gate terminal of the first transistor TR1_b during an active period of the initialization control signal Gln. In this case, the fourth transistor TR4_b may operate in a linear region. That is, the fourth transistor TR4_b may initialize the gate terminal of the first transistor TR1_b to the initialization voltage Vint during the active period of the initialization control signal Gln. As a result, the initialization control signal Gln may serve as a data initialization signal.

The initialization voltage Vint may be sufficiently lower than the voltage of the data signal Dm maintained by the storage capacitor CST_b during a previous frame, and the initialization voltage Vint may be provided to the gate terminal of the first transistor TR1_b, which may be a p-channel metal oxide semiconductor (PMOS) transistor. Alternatively, the initialization voltage Vint may be sufficiently higher than the voltage of the data signal Dm maintained by the storage capacitor CST_b during the previous frame, and the initialization voltage Vint may be provided to the gate terminal of the first transistor TR1_b, which may be an n-channel metal oxide semiconductor (NMOS) transistor.

The initialization control signal Gin may be defined as being substantially the same as a scan signal Sn−1 of a previous stage. For example, the initialization control signal Gln, which is applied to an n-th row (where n is an integer of 2 or greater) of pixels among a plurality of rows of pixels included in a display panel (not illustrated), may be substantially the same as the scan signal Sn−1 previously applied to an (n−1)-th row of pixels among the plurality of rows of pixels included in the display panel. That is, the scan signal Sn−1 previously applied to the (n−1)-th row of pixels may also be applied to the n-th row of pixels. As a result, the data signal Dm may be applied to the (n−1)-th row of pixels, and at the same time, the gate terminal of the first transistor TR1_b, which is included in each of the n-th row of pixels, may be initialized to the initialization voltage Vint.

The fifth transistor TR5_b may include a gate terminal, a first terminal and a second terminal. The gate terminal of the fifth transistor TR5_b may receive the emission signal EM. The first terminal of the fifth transistor TR5_b may receive the first power supply voltage ELVDD. The second terminal of the fifth transistor TR5_b may be connected to the first terminal of the first transistor TR1_b. For example, the first terminal of the fifth transistor TR5_b may be a source terminal, and the second terminal of the fifth transistor TR5_b may be a drain terminal. In another example, the first terminal of the fifth transistor TR5_b may be a drain terminal, and the second terminal of the fifth transistor TR5_b may be a source terminal.

The fifth transistor TR5_b may provide the first power source voltage ELVDD to the first terminal of the first transistor TR1_b during the active period of the emission signal EM. On the other hand, the fifth transistor TR5_b may interrupt the provision of the first power supply voltage ELVDD during an inactive period of the emission signal EM. In this case, the fifth transistor TR5_b may operate in a linear region. Specifically, the fifth transistor TR5_b provides the first power source voltage ELVDD to the first terminal of the first transistor TR1_b during the active period of the emission signal EM so that the first transistor TR1_b can generate the driving current Id. Also, the fifth transistor TR5_b interrupts the provision of the first power supply voltage ELVDD during the inactive period of the emission signal EM so that the data signal Dm, which is applied to the first terminal of the first transistor TR1_b, can be applied to the gate terminal of the first transistor TR1_b.

The sixth transistor TR6_b may include a gate terminal, a first terminal and a second terminal. The gate terminal of the sixth transistor TR6_b may receive the light emission signal EM. The first terminal of the sixth transistor TR6_b may be connected to the second terminal of the first transistor TR1_b. The second terminal of the sixth transistor TR6_b may be connected to the first terminal of the OLED "OLED_b". For example, the first terminal of the sixth transistor TR6_b may be a source terminal, and the second terminal of the sixth transistor TR6_b may be a drain terminal. In another example, the first terminal of the sixth transistor TR6_b may be a drain terminal, and the second terminal of the sixth transistor TR6_b may be a source terminal.

The sixth transistor TR6_b may provide the driving current Id, which is generated by the first transistor TR1_b during the active period of the emission signal EM, to the OLED "OLED_b". In this case, the sixth transistor TR6_b may operate in a linear region. That is, the sixth transistor TR6_b provides the driving current Id to the OLED "OLED_b" so that the OLED "OLED_b" can output light. The sixth transistor TR6_b electrically isolates the first transistor TR1_b and the OLED "OLED_b" from each other during the inactive period of the emission signal EM so that the data signal Dm (particularly, the data signal Dm compensated by as much the threshold voltage of the first transistor TR1_b) can be provided to the gate terminal of the first transistor TR1_b.

The seventh transistor TR7_b may include a gate terminal, a first terminal and a second terminal. The gate terminal of the seventh transistor TR7_b may receive an initialization control signal Gln−1 of the previous stage. The first terminal of the seventh transistor TR7_b may receive the initialization voltage Vint. The second terminal of the seventh transistor TR7_b may be connected to the first terminal of the OLED "OLED_b". For example, the first terminal of the seventh transistor TR7_b may be a source terminal, and the second terminal of the seventh transistor TR7_*b* may be a drain terminal. In another example, the first terminal of the seventh transistor TR7_*b* may be a drain terminal, and the second terminal of the seventh transistor TR7_*b* may be a source terminal.

The seventh transistor TR7_*b* may provide the initialization voltage Vint to the first terminal of the OLED "OLED_b" during an active period of the initialization control signal Gln−1. In this case, the seventh transistor TR7_*b* may operate in a linear region. That is, the seventh transistor TR7_*b* may initialize the first terminal of the OLED "OLED_b" to the initialization voltage Vint during the active period of the initialization control signal Gln−1. As a result, the initialization control signal Gln−1 can serve as a diode initialization signal.

Figure 7:
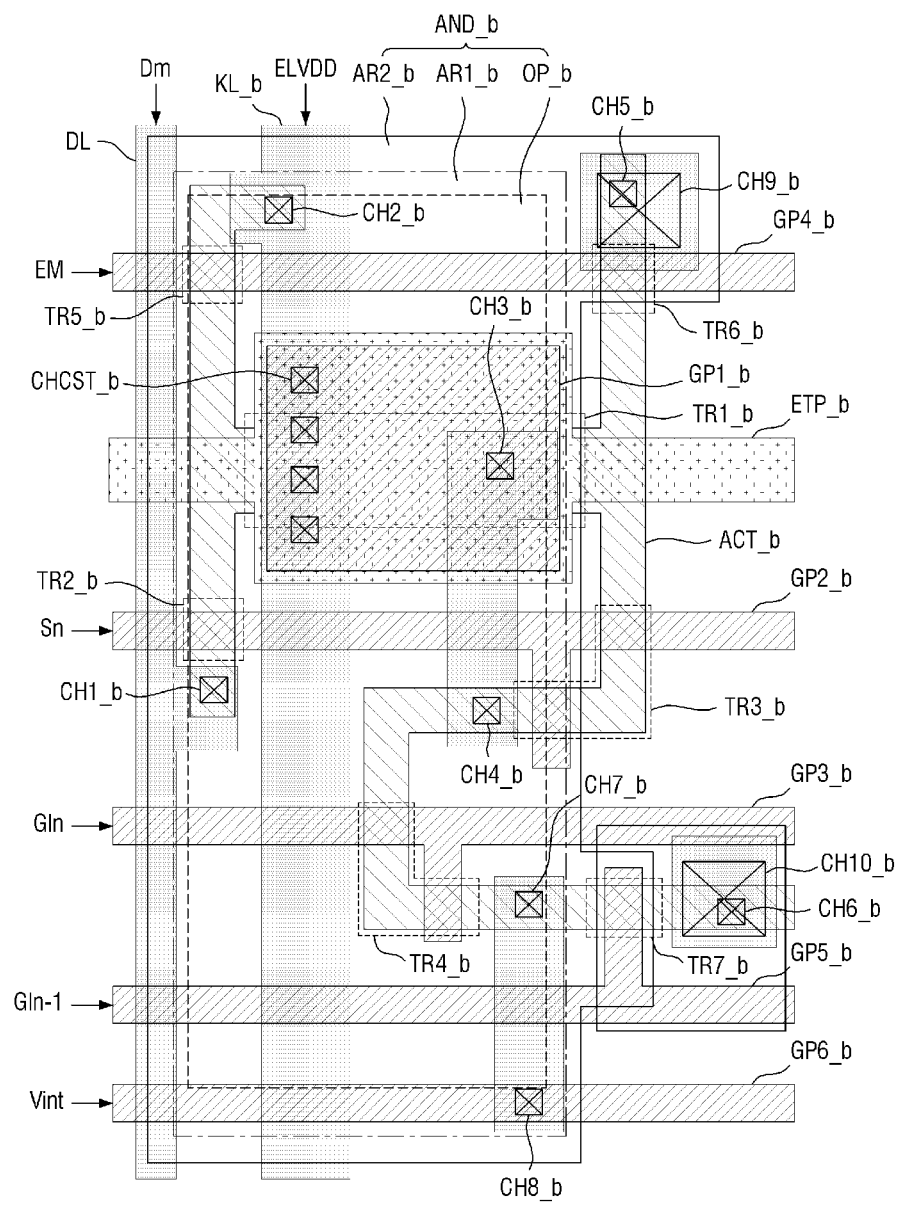
FIG. 7 is a layout view of a pixel of the organic light-emitting display device according to the exemplary embodiment of FIG. 6.
Figure 8:
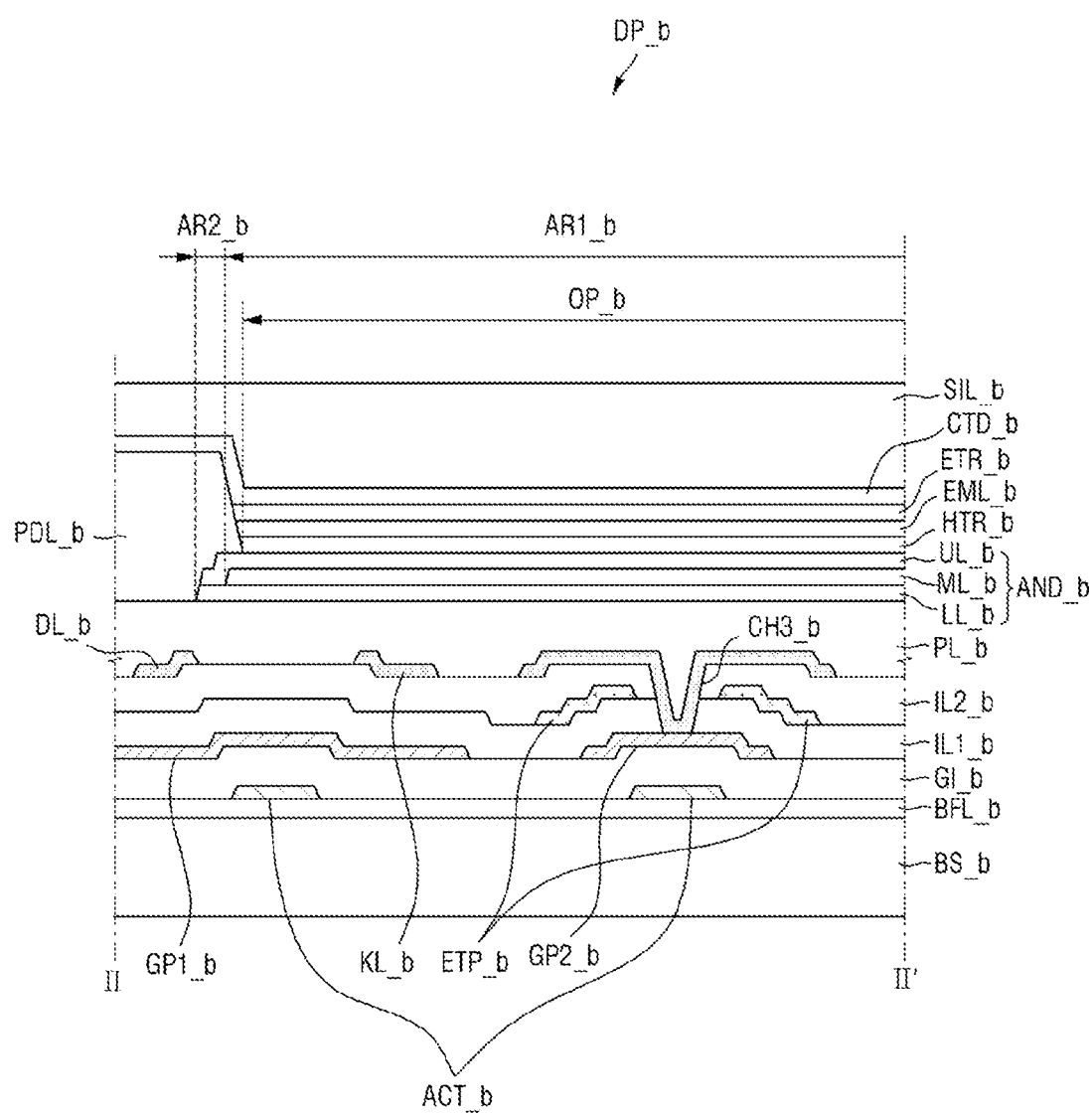
FIG. 8 is a cross-sectional view taken along line II-II' of FIG. 7.

FIG. 7 is a layout view of a pixel of the organic light-emitting display device according to the exemplary embodiment of FIG. 6, and FIG. 8 is a cross-sectional view taken along line II-II' of FIG. 7.

Referring to FIGS. 7 and 8, a display panel DP_b includes a base substrate BS_b, a buffer layer BFP_b, active patterns ACT_b, a gate insulating layer GI_b, first through sixth gate patterns GP1_*b* through GP6_*b*, a first interlayer insulating layer IL1_*b*, conductive patterns ETP_b, a second interlayer insulating layer IL2_*b*, a data line DL_b, a first power line KL_b, a passivation layer PL_b, an OLED "OLED_b" and an encapsulation layer SIL_b.

The base substrate BS_b is formed of an insulating material.

The buffer layer BFL_b is disposed on the base substrate BS_b. The buffer layer BFL_b is almost the same as the buffer layer BFL of FIG. 4, and thus, a detailed description thereof will be omitted.

The active patterns ACT_b are disposed on the buffer layer BFL_b. The active patterns ACT_b may comprise silicon or a semiconductor oxide including a binary compound ABx, a ternary compound (ABxCy), or a quaternary compound (ABxCyDz) containing indium (In), zinc (Zn), gallium (Ga), tin (Sn), Ti, Al, hafnium (Hf), zirconium (Zr), or magnesium (Mg). These may be used alone or in any mixture thereof.

The active patterns ACT_b may have regions doped with a high concentration of impurities to have a high electric conductivity. Accordingly, the active patterns ACT_b may form the first through seventh transistors TR1_*b* through TR7_*b*.

The gate insulating layer GI_b is disposed to cover the active patterns ACT_b. The gate insulating layer GI_b is almost the same as the gate insulating layer GI of FIG. 4, and thus, a detailed description thereof will be omitted.

The first through sixth gate patterns GP1_*b* through GP6_*b* are disposed on the gate insulating layer GI_b. The first through sixth gate patterns GP1_*b* through GP6_*b* may comprise a metal, an alloy, a metal nitride, a conductive metal oxide, or a transparent conductive material. For example, the first through sixth gate patterns GP1_*b* through GP6_*b* may be formed of a metal such as Al, Ag, tungsten (W), copper (Cu), Ni, Cr, Mo, Ti, Pt, tantalum (Ta), Nd, scandium (Sc), or an alloy or a conductive nitride thereof. The first through sixth gate patterns GP1_*b* through GP6_*b* may also comprise any one of strontium ruthenium oxide (SrRuxOy), zinc oxide (ZnOx), ITO, tin oxide (SnOx), indium oxide (InOx), gallium oxide (GaOx), or IZO.

The first gate pattern GP1_*b* may overlap with the active patterns ACT_b to form the first transistor TR1_*b*. The first transistor TR1_*b* may generate the driving current Id of FIG. 6, which is provided to the OLED "OLED_b" of FIG. 6, and the OLED "OLED_b" may emit light based on the driving current Id.

The second gate pattern GP2_*b* may overlap with the active patterns ACT_b to form the second and third transistors TR2_*b* and TR3_*b*. The scan signal Sn may be provided to the second gate pattern GP2_*b*.

The third gate pattern GP3_*b* may overlap with the active patterns ACT_b to form the fourth transistor TR4_*b*. The initialization control signal Gln may be provided to the third gate pattern GP3_*b*.

The fourth gate pattern GP4_*b* may overlap with the active patterns ACT_b to form the fifth and sixth transistors TR5_*b* and TR6_*b*. The emission signal EM may be provided to the fourth gate pattern GP4_*b*.

The fifth gate pattern GP5_*b* may overlap with the active patterns ACT_b to form the seventh transistor TR7_*b*. The initialization control signal Gln−1 may be provided to the fifth gate pattern GP5_*b*.

The initialization voltage Vint may be provided to the sixth gate pattern GP6_*b*.

The first interlayer insulating layer IL1_*b* is disposed on the first through sixth gate patterns GP1_*b* through GP6_*b*. The first interlayer insulating layer IL1_*b* includes an organic film and/or an inorganic film. Specifically, the first interlayer insulating layer IL1_*b* may include a plurality of inorganic thin films. The plurality of inorganic thin films may include a silicon nitride layer and a silicon oxide layer.

The conductive patterns ETP_b are disposed on the first interlayer insulating layer IL1_*b*. The conductive patterns ETP_b may be disposed to overlap with the first gate pattern GP1_*b*. Accordingly, the conductive patterns ETP_B and the first gate pattern GP1_*b* may form the storage capacitor CST_b of FIG. 6 together.

The conductive patterns ETP_b may comprise a metal alloy, a metal nitride, a conductive metal oxide, or a transparent conductive material. These may be used alone or in any mixture thereof.

The second interlayer insulating layer IL2_*b* is disposed on the conductive patterns ETP_b. The second interlayer insulating layer IL2_*b*, like the first interlayer insulating layer IL1_*b*, includes an organic film and/or an inorganic film.

The data line DL_b and the first power line KL_b are disposed on the second interlayer insulating layer IL2_*b*. The data line DL_b may receive the data signal Dm. The first power line KL_b may receive the first power supply voltage ELVDD.

The passivation layer PL_b is disposed on the data line DL_b and the first power line KL_b. The passivation layer PL_b is almost the same as the passivation layer PL of FIG. 4, and thus, a detailed description thereof will be omitted.

The anode electrode AND_b is disposed on the passivation layer PL_b. An opening OP_b of a pixel defining layer PL_b exposes the anode electrode AND_b.

The anode electrode AND_b may be a pixel electrode and an anode electrode. The anode electrode AND_b may have a multilayer structure consisting of a plurality of layers that are formed of a transparent metal oxide and a metal.

The anode electrode AND_b includes two areas having different stack structures, as viewed from a direction perpendicular to the top surface of the base substrate BS_b, i.e., the viewpoint of FIG. 7.

The anode electrode AND_b includes a first area AR1_*b* in which a lower electrode layer LL_b, an intermediate electrode layer ML_b and an upper electrode layer UL_b are sequentially stacked and a second area AR2_*b* in which the lower electrode layer LL_b and the upper electrode layer UL_b are sequentially stacked.

The second area AR2_b may be disposed to surround the first area AR1_b. Accordingly, the first area AR1_b can be sufficiently secured, and the second area AR2_b can also be sufficiently secured.

The upper electrode layer UL_b may be formed to overlap with the intermediate electrode layer ML_b. Accordingly, the anode electrode AND_b can smoothly transmit signals to a hole transport region HTR_b.

The first region AR1_b may be disposed to overlap with an emission layer EML_b. Accordingly, since the intermediate electrode layer ML_b, which has a high reflectivity, is disposed in the first area AR1_b, the amount of light emitted upward can be sufficiently secured.

Since the anode electrode AND b includes the first and second areas AR1_b and AR2_b, the degradation of the display quality of the organic light-emitting display device can be minimized. Specifically, since the anode electrode AND_b is composed of three layers, resistance may increase locally near the surfaces of the three layers. That is, in areas near the surfaces of the three layers of the anode electrode AND_b, differences in electric potential are generated among the three layers of the anode electrode AND due to the formation of a hole injection barrier, and as a result, high resistance may be generated against the transmission of signals. However, the generation of such high resistance can be prevented because the second area AR2_b includes a total of two contact surfaces, i.e., the contact surface between the lower electrode layer LL_b and the intermediate electrode layer ML_b and the contact surface between the intermediate electrode layer ML_b and the upper electrode layer UL_b, whereas the first area AR1_b includes only one contact surface, i.e., the contact surface between the lower electrode layer LL_b and the upper electrode layer ML_b. Thus, a voltage can be smoothly transmitted by the anode electrode AND_b, and as a result, the display quality of the organic light-emitting display device can be improved.

The anode electrode AND_b is almost the same as the anode electrode AND of FIG. 4, and thus, a detailed description thereof will be omitted.

The hole transport region HTR_b is disposed on the anode electrode AND_b. The hole transport region HTR_b is almost the same as the hole transport region HTR of FIG. 4, and thus, a detailed description thereof will be omitted.

The emission layer EML_b is disposed on the hole transport region HTR_b. The emission layer EML_b is almost the same as the emission layer EML of FIG. 4, and thus, a detailed description thereof will be omitted.

An electron transport region ETR_b is disposed on the emission layer EML_b. The electron transport region ETR_b is almost the same as the electron transport region ETR of FIG. 4, and thus, a detailed description thereof will be omitted.

A cathode electrode CTD_b is disposed on the electron transport region ETR_b. The cathode electrode CTD_b is almost the same as the cathode electrode CTD of FIG. 4, and thus, a detailed description thereof will be omitted.

The encapsulation layer SIL_b is disposed on the cathode electrode CTD_b. The encapsulation layer SIL_b is almost the same as the encapsulation layer SIL of FIG. 4, and thus, a detailed description thereof will be omitted. For connection of various wiring layers illustrated in FIG. 7, first through ninth contact holes CH1_b through CH9_b are provided, and as a result, the first through seventh transistors TR1_b through TR7_b can operate properly.

Figure 9:
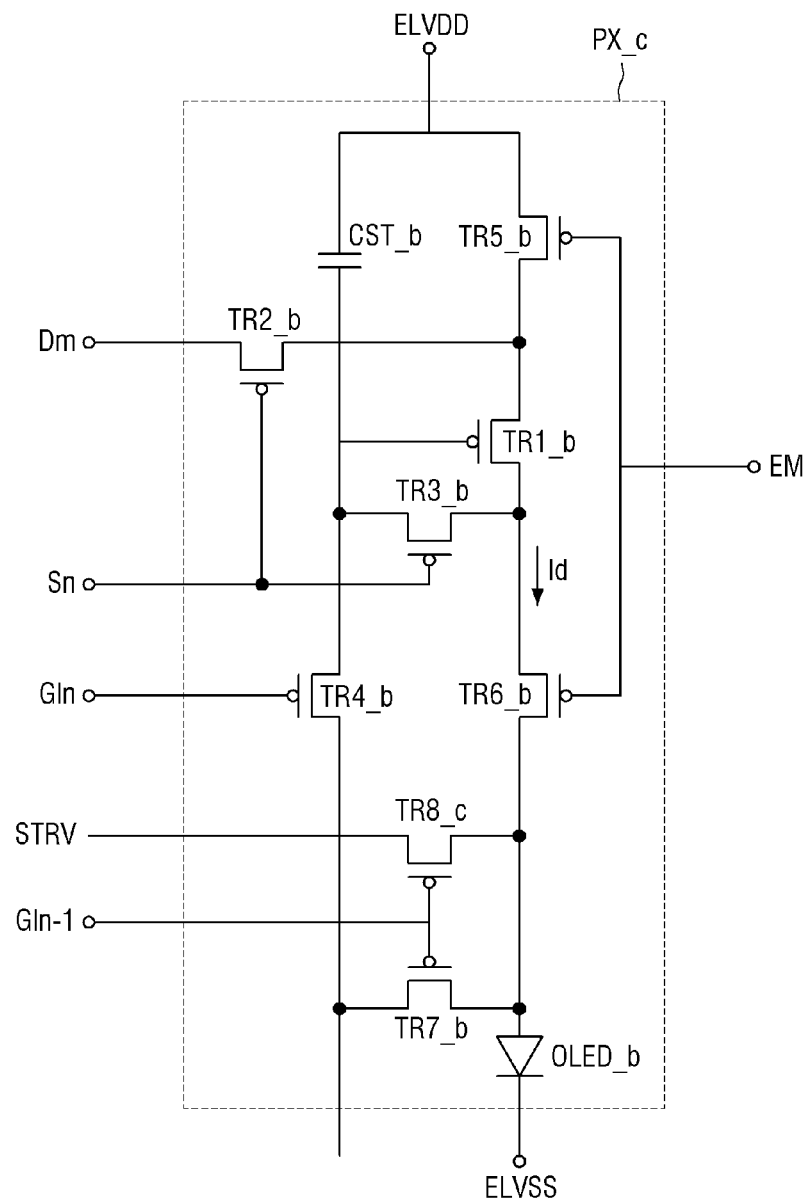
FIG. 9 is an equivalent circuit diagram of a pixel of an organic light-emitting display device according to another exemplary embodiment of the present disclosure.

FIG. 9 is an equivalent circuit diagram of a pixel of an organic light-emitting display device according to another exemplary embodiment of the present disclosure.

A pixel PX_c of FIG. 9 differs from the pixel PX_b of FIG. 6 in that it further includes an eighth transistor TR8_c. The pixel PX_c of FIG. 9 will hereinafter be described, focusing mainly on differences with the pixel PX_b of FIG. 6.

Referring to FIG. 9, the pixel PX_c includes the eighth transistor TR8_c.

The eighth transistor TR8_c may provide a stress voltage STRV to a first terminal of an OLED "OLED_b" during an active period of an initialization control signal Gln−1 of a previous stage. In this case, the eighth transistor TR8_c may operate in a linear region. That is, the eighth transistor TR8_b may provide the stress voltage STRV to the first terminal of the OLED "OLED_b" during the active period of the initialization control signal Gln−1.

Figure 11:
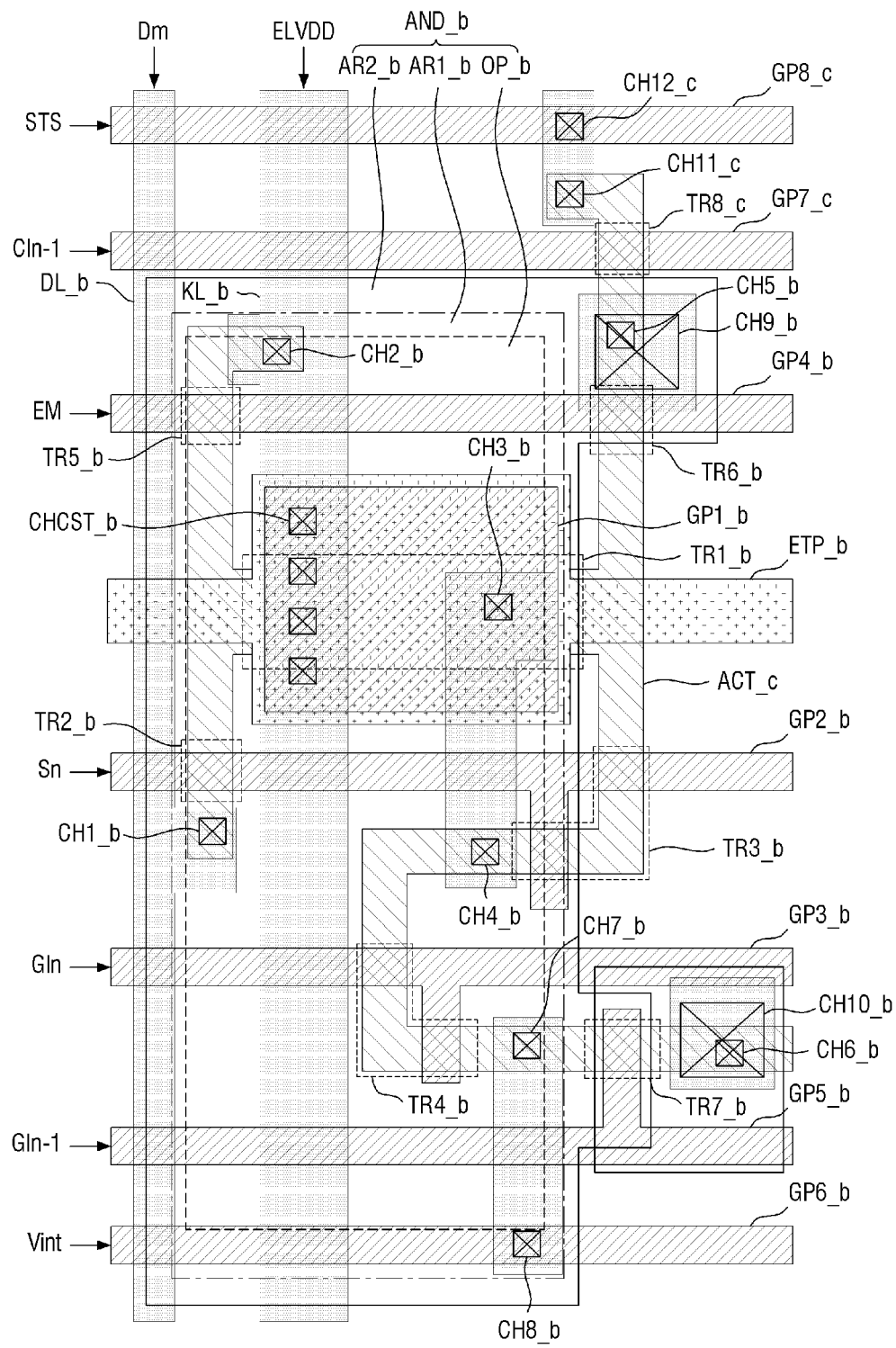
FIG. 11 is a layout view of a pixel of the organic light-emitting display device according to the exemplary embodiment of FIG. 9.

Accordingly, an initialization voltage Vint, which is provided by the seventh transistor TR7_b, and the stress voltage STRV, which is provided by the eighth transistor TR8_c, can be simultaneously provided to the first terminal of the OLED "OLED_b", i.e., the anode electrode AND_b of FIG. 11. Thus, two different voltages can be simultaneously provided to the anode electrode AND_b of the OLED "OLED_b". As a result, the anode electrode AND_b of the OLED "OLED_b" can be overloaded by the difference between the initialization voltage Vint and the stress voltage STRV. Accordingly, since the anode electrode AND_b of FIG. 11 is composed of three layers, a hole injection barrier can be eliminated from areas near the surfaces of the three layers of the anode electrode AND_b. Therefore, the resistance of the OLED "OLED_b" can be reduced, and as a result, the display quality of the organic light-emitting display device can be improved.

The organic light-emitting display device according to the exemplary embodiment of FIG. 9 will hereinafter be described in further detail with reference to FIG. 10.

Figure 10:
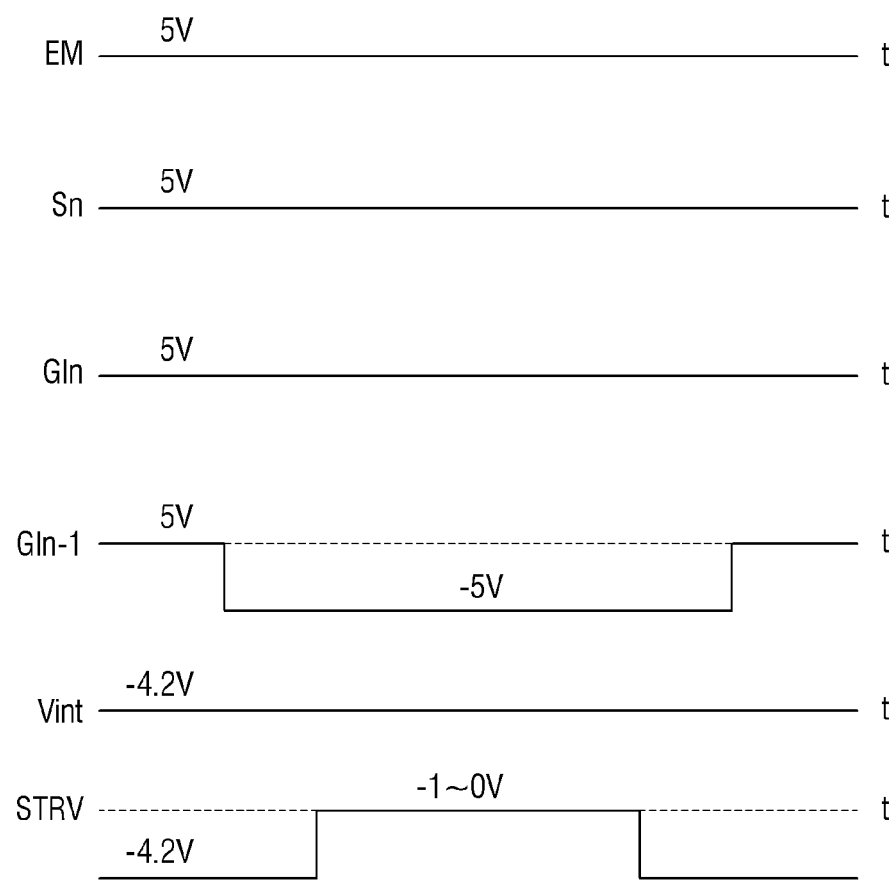
FIG. 10 is a schematic view illustrating the waveforms of signals applied to a pixel of the organic light-emitting display device according to the exemplary embodiment of FIG. 9.

FIG. 10 is a schematic view illustrating the waveforms of signals applied to a pixel of the organic light-emitting display device according to the exemplary embodiment of FIG. 9.

Specifically, FIG. 10 illustrates the voltages of signals applied to the anode electrode AND_b of the OLED "OLED_b" of FIG. 9 while the anode electrode AND_b is being overloaded by the difference between the initialization voltage Vint and the stress voltage STRV.

Referring to FIG. 10, the emission signal EM, the scan signal Sn, and the initialization control signal Gln all maintain an off-level voltage during the active period of the initialization control signal Gln−1.

In response to the initialization control signal Gln−1 being activated, the seventh and eighth transistors TR7_b and TR8_c of FIG. 9 are turned on so that the initialization voltage Vint and the stress voltage STRV can both be provided to the anode electrode AND_b of the OLED "OLED_b" of FIG. 9. During the active period of the initialization control signal Gln−1, the initialization voltage Vint is −4.2V, and the stress voltage STRV is −1V to 0V. As a result, a voltage difference is generated in the OLED "OLED_b" of FIG. 11. Due to the generated voltage difference, the anode electrode AND_b is overloaded, and as a result, the display quality of the organic light-emitting display device is improved.

The aforementioned process of overloading the anode electrode AND_b may be performed in a testing stage immediately after the fabrication of the organic light-emitting display device. After the overloading of the anode electrode AND_b, the initialization voltage Vint may be provided to the line to which the stress voltage STRV is applied, and the seventh and eighth transistors TR7_b and TR8_c of FIG. 9 may operate in the same manner.

FIG. 11 is a layout view of a pixel of the organic light-emitting display device according to the exemplary embodiment of FIG. 9.

The pixel of FIG. 11 differs from the pixel of FIG. 7 in that it further includes seventh and eighth gate patterns GP7_c and GP8_c and the eighth transistor TR8_c. The pixel of FIG. 11 will hereinafter be described, focusing mainly on differences with the pixel of FIG. 7.

Referring to FIG. 11, the seventh gate pattern GP7_c may overlap with the active patterns ACT_b to form the eighth transistor TR8_c. The initialization control signal Gln−1 may be provided to the seventh gate pattern GP7_c.

The stress voltage STRV may be provided to the eighth gate pattern GP8_c. The stress voltage STRV provided to the eighth gate pattern GP8_c may be provided to the active patterns ACT_b via eleventh and twelfth contact holes CH11_c and CH12_c and may also be provided to the anode electrode AND_b of the OLED "OLED_b" via the eighth transistor TR8_c.

However, the effects of the inventive concept are not restricted to the one set forth herein. The above and other effects of the inventive concept will become more apparent to one of daily skill in the art to which the inventive concept pertains by referencing the claims.

What is claimed is:

1. An organic light-emitting display device, comprising:
a substrate;
a thin-film transistor (TFT) disposed on the substrate;
an overcoat layer disposed on the TFT;
a first electrode disposed on the overcoat layer and including a lower electrode layer, an intermediate electrode layer which is disposed on the lower electrode layer, and an upper electrode layer which is disposed on the intermediate electrode layer;
an emission layer disposed on the first electrode; and
a second electrode disposed on the emission layer,
wherein the first electrode includes a first area in which the lower electrode layer, the intermediate electrode layer and the upper electrode layer are sequentially stacked and a second area in which the lower electrode layer and the upper electrode layer are sequentially stacked,
wherein the lower electrode layer is in direct contact with the upper electrode layer in the second area.

2. The organic light-emitting display device of claim 1, wherein the intermediate electrode layer has a higher reflectivity than the lower and upper electrode layers.

3. The organic light-emitting display device of claim 2, wherein
the lower and upper electrode layers are transparent electrodes, and
the intermediate electrode layer is a reflective electrode.

4. The organic light-emitting display device of claim 1, wherein the first area is disposed to overlap with the emission layer.

5. The organic light-emitting display device of claim 1, wherein the overcoat layer further comprising a contact hole disposed to overlap with the first electrode,
wherein the TFT and the first electrode are electrically connected through the contact hole, and
wherein the contact hole is disposed in the second area.

6. The organic light-emitting display device of claim 1, wherein the second area is disposed to surround the first area.

7. The organic light-emitting display device of claim 6, wherein the upper electrode layer is disposed to overlap with the intermediate electrode layer.

8. The organic light-emitting display device of claim 1, wherein the second area is provided as multiple patterns disposed along the edges of the first area and spaced apart from one another.

9. The organic light-emitting display device of claim 1, wherein the intermediate electrode layer is formed of aluminum (Al), silver (Ag), gold (Au), platinum (Pt), chromium (Cr), or an alloy thereof.

10. The organic light-emitting display device of claim 9, wherein the first area is disposed to overlap with the opening.

11. The organic light-emitting display device of claim 10, wherein the second area is not disposed to overlap with the opening.

12. The organic light-emitting display device of claim 1, further comprising:
a pixel defining layer disposed between the first and second electrodes,
wherein the emission layer is disposed in an opening of the pixel defining layer.

* * * * *